(12) United States Patent
Strode (10) Patent No.: US 8,547,270 B1
(45) Date of Patent: Oct. 1, 2013

(54) SYSTEMS FOR SUB DIGITAL-TO-ANALOG CONVERTER GAIN TRIM IN SUCCESSIVE-APPROXIMATION-REGISTER ANALOG-TO-DIGITAL CONVERTERS

(75) Inventor: Jonathan Ronald Francis Strode, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 45 days.

(21) Appl. No.: 13/234,595

(22) Filed: Sep. 16, 2011

(51) Int. Cl.
*H03M 1/38* (2006.01)
(52) U.S. Cl.
USPC .......................................... 341/161; 341/155

(58) Field of Classification Search
USPC .................................. 341/155, 121, 161, 144
See application file for complete search history.

(56) References Cited

U.S. PATENT DOCUMENTS

| | | | | |
|---|---|---|---|---|
| 4,851,838 A | * | 7/1989 | Shier | 341/121 |
| 4,947,169 A | * | 8/1990 | Smith et al. | 341/121 |
| 5,638,072 A | * | 6/1997 | Van Auken et al. | 341/141 |

* cited by examiner

*Primary Examiner* — Brian Young (57) ABSTRACT

A system for a successive-approximation-register analog-to-digital converter (SAR ADC) includes a gain trim module and an SAR control module. The gain trim module is configured to selectively trim a gain of a sub capacitive digital-to-analog converter (DAC) of the SAR ADC. The SAR control module controls the gain trim module based on an accumulated error associated with a main capacitive DAC of the SAR ADC.

20 Claims, 8 Drawing Sheets

SYSTEMS FOR SUB DIGITAL-TO-ANALOG CONVERTER GAIN TRIM IN SUCCESSIVE-APPROXIMATION-REGISTER ANALOG-TO-DIGITAL CONVERTERS

FIELD

The present disclosure relates to analog-to-digital converters, and more particularly to systems for sub digital-to-analog (DAC) gain trim in successive-approximation-register analog-to-digital converters (SAR ADCs).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1A:
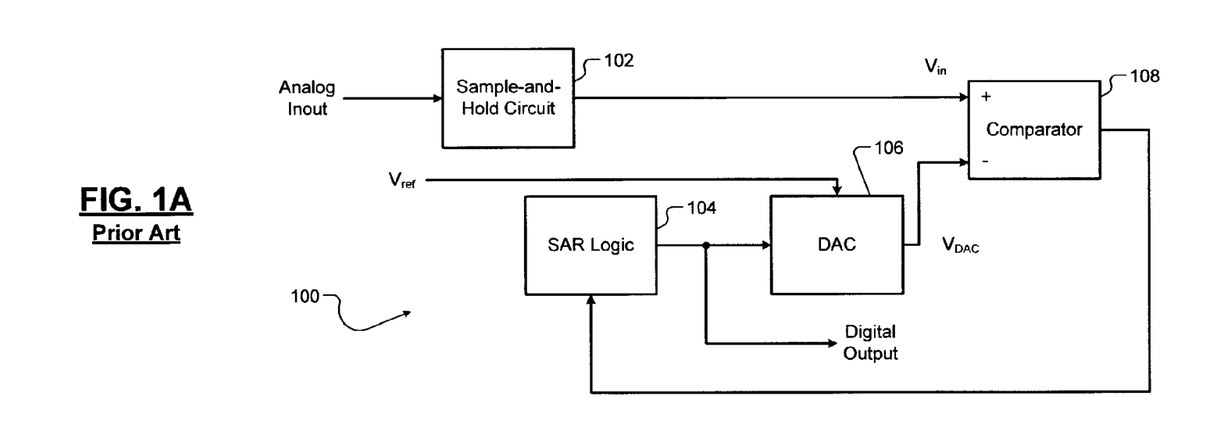
FIG. 1A illustrates a successive-approximation-register analog-to-digital converter (SAR ADC)
Figure 1B:
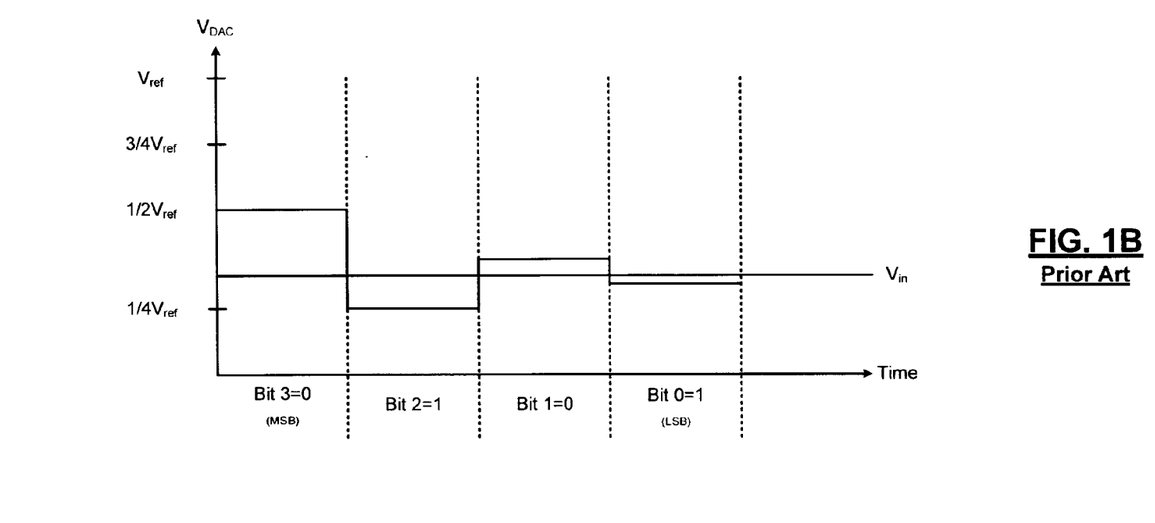
FIG. 1B illustrates an example of a 4-bit conversion performed by a SAR ADC using a binary search algorithm.

Referring now to FIGS. 1A and 1B, a successive-approximation-register analog-to-digital converter (SAR ADC) 100 is shown. In FIG. 1A, the SAR ADC 100 includes a sample-and-hold circuit (S/H) 102, SAR logic 104, a digital-to-analog (DAC) converter 106, and a comparator 108. The S/H circuit 102 receives an analog input signal to be converted and outputs an input voltage $V_{IN}$ to the comparator 108.

The SAR logic 104 includes an N-bit register to implement a binary search algorithm to convert the analog input signal. The N-bit register is initially set to a midscale value, for example, to 100 . . . 00, where the most significant bit (MSB) is set to 1. The SAR logic 104 outputs the midscale value stored in the N-bit register to the DAC 106. The DAC 106 converts the N-bit input received from the SAR logic 104 and outputs a voltage $V_{DAC}$ to the comparator 108. Since the N-bit input is 100 . . . 00, $V_{DAC}=V_{REF}/2$, where $V_{REF}$ is the reference voltage provided to the SAR ADC 100.

The comparator 108 compares $V_{IN}$ to $V_{DAC}$ and determines if $V_{IN}$ is less than $V_{DAC}$ or greater than $V_{DAC}$. If $V_{IN}$ is greater than $V_{DAC}$, the output of the comparator 108 is a logic high, or 1, and the MSB of the N-bit register remains at 1. Conversely, if $V_{IN}$ is less than $V_{DAC}$, the output of the comparator 108 is a logic low, or 0, and the MSB of the N-bit register is cleared to logic 0. This step is generally referred to as MSB testing.

The SAR logic 104 then moves to the next bit and forces that bit high. The comparator 108 performs another comparison. The process continues to the least significant bit (LSB), which concludes the conversion process. When the conversion is complete, an N-bit digital word is output from the N-bit register. The N-bit word is a digital representation of the analog input. This process of converting an analog signal using the SAR logic 104, the DAC 106, and the comparator 108 is called the binary search algorithm.

In FIG. 1B, an example of a 4-bit conversion using the binary search algorithm is shown (i.e., N=4). In the example, the DAC 106 initially receives $1000_2$ from a 4-bit register in the SAR logic 104. That is, bit 3, the MSB, of the 4-bit register is set to 1. A first comparison shows, for example, that $V_{IN}<V_{DAC}$. Therefore, bit 3 of the 4-bit register is reset to 0. The DAC 106 then receives $0100_2$, and a second comparison is performed. If $V_{IN}>V_{DAC}$, for example, bit 2 of the 4-bit register remains at 1. The DAC 106 then receives $0110_2$, and a third comparison is performed. Bit 1 is reset to 0 if $V_{IN}<V_{DAC}$, for example, and the DAC 106 then receives $0101_2$ for a final comparison. Finally, bit 0 remains at 1 if, for example, $V_{IN}>V_{DAC}$. Thus, a 4-bit word 0101 is output from the 4-bit register, which is a digital representation of the analog input.

The S/H circuit 102 shown in FIG. 1A can be embedded in the DAC 106. Many SAR ADCs use a capacitive DAC that provides an inherent S/H function. A capacitive DAC includes an array of N capacitors with binary-weighted values and one dummy LSB capacitor.

Figure 2:
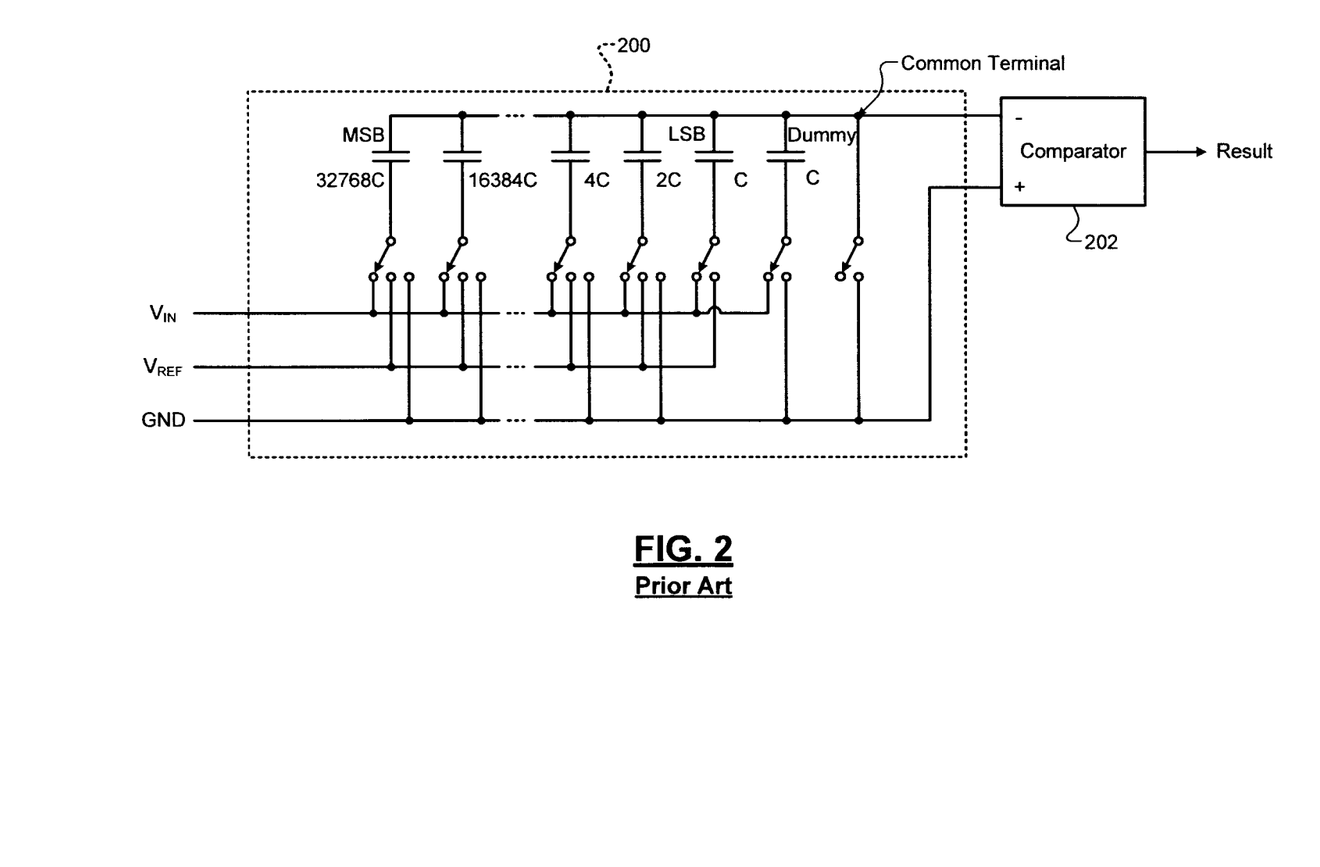
FIG. 2 illustrates an SAR ADC that includes a capacitive digital-to-analog converter (DAC)

Referring now to FIG. 2, an example of a 16-bit capacitive DAC 200 connected to a comparator 202 is shown. The DAC 200 includes an array of capacitors having binary weighted values. One end of each capacitor is connected to a common terminal. The other end of each capacitor is connected to a switch. The switch connected to each capacitor, except the dummy capacitor, connects the capacitor to an analog input signal ($V_{IN}$), a reference voltage ($V_{REF}$), or ground (GND) depending on control signals received from the SAR logic 104 shown in FIG. 1. The switch connected to the dummy capacitor connects the dummy capacitor to $V_{IN}$ or ground. A switch selectively connects the common terminal to ground. The common terminal is connected to a first input of the comparator 202. A second input of the comparator 202 is connected to ground.

During an acquisition phase, the common terminal of the capacitors is connected to ground, and the other terminals of the capacitors are connected to the analog input signal ($V_{IN}$). After acquisition, the common terminal is disconnected from ground, and the other terminals of the capacitors are disconnected from $V_{IN}$. Effectively, a charge proportional to the input voltage is trapped on the capacitors. The other terminals of the capacitors are then connected to ground, driving the common terminal negative to a voltage equal to $-V_{IN}$.

As a first step in the binary search algorithm, a bottom plate of the MSB capacitor is disconnected from ground and connected to $V_{REF}$. This drives the common terminal in the positive direction by an amount equal to $\frac{1}{2}V_{REF}$. Therefore, $V_{COMMON}=-V_{IN}+\frac{1}{2}\times V_{REF}$. The output of the comparator 202 is logic 1 if $V_{COMMON}<0$ (i.e., $V_{IN}>\frac{1}{2}\times V_{REF}$). The output of the comparator 202 is logic 0 if $V_{IN}<\frac{1}{2}\times V_{REF}$. If the comparator output is logic 1, then the bottom plate of the MSB capacitor stays connected to $V_{REF}$. Otherwise the bottom plate of the MSB capacitor is connected back to ground. The bottom plate of the next smaller capacitor is then connected to $V_{REF}$, and a new $V_{COMMON}$ voltage is compared to ground. This process continues until all the bits have been determined. In general, $V_{COMMON}=-V_{IN}+(B_{N-1}\times V_{REF}/2)+(B_{N-2}\times V_{REF}/4)+(B_{N-3}\times V_{REF}/8)+ \ldots +(B0\times V_{REF}/2^{N-1}$ (B_comparator output/ADC output bits)).

SUMMARY

A system for a successive-approximation-register analog-to-digital converter (SAR ADC) includes a gain trim module and an SAR control module. The gain trim module is configured to selectively trim a gain of a sub capacitive digital-to-analog converter (DAC) of the SAR ADC. The SAR control module controls the gain trim module based on an accumulated error associated with a main capacitive DAC of the SAR ADC.

A successive-approximation-register analog-to-digital converter (SAR ADC) includes a main capacitive digital-to-analog converter (DAC), a sub capacitive DAC, a comparator, a gain trim module, and an SAR control module. The main capacitive DAC selectively generates a first output based on an input value, a reference value, and one or more of a first plurality of capacitors. The sub capacitive DAC selectively generates a second output based on the input value, the reference value, and one or more of a second plurality of capacitors. The comparator generates comparisons based on at least one of the first and second outputs. The gain trim module is configured to selectively trim a gain of the sub capacitive DAC. The SAR control module selectively controls the gain trim module based on an accumulated error associated with the main capacitive DAC, wherein the accumulated error is based on the comparisons generated by the comparator.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

As previously mentioned, a successive-approximation-register analog-to-digital converter (SAR ADC) may include a capacitive digital-to-analog converter (DAC). The capacitive DAC may include an array of capacitors having binary weighted values. Each capacitor in the array of capacitors may be associated with a bit of the capacitive DAC. A smallest capacitor in the array of capacitors may be associated with a least significant bit (LSB). Similarly, a largest capacitor in the array of capacitors may be associated with a most significant bit (MSB). The remaining capacitors in the array of capacitors may be similarly associated with remaining bits of the capacitive DAC.

As the size (number of bits) of the capacitive DAC increases, larger capacitors in the array of capacitors (e.g., the MSB capacitor) increase in size by a factor of two. For example, the 16-bit capacitive DAC shown in FIG. 2 has an MSB capacitor that is 32,768 times as large as the LSB capacitor. High resolution capacitive DACs, therefore, may require a significant amount of integrated circuit (IC) surface area. The increased chip surface area increases costs. The capacitive DAC, therefore, may be divided into two or more capacitive DACs, or a main capacitive DAC and one or more sub capacitive DACs.

Figure 3A:
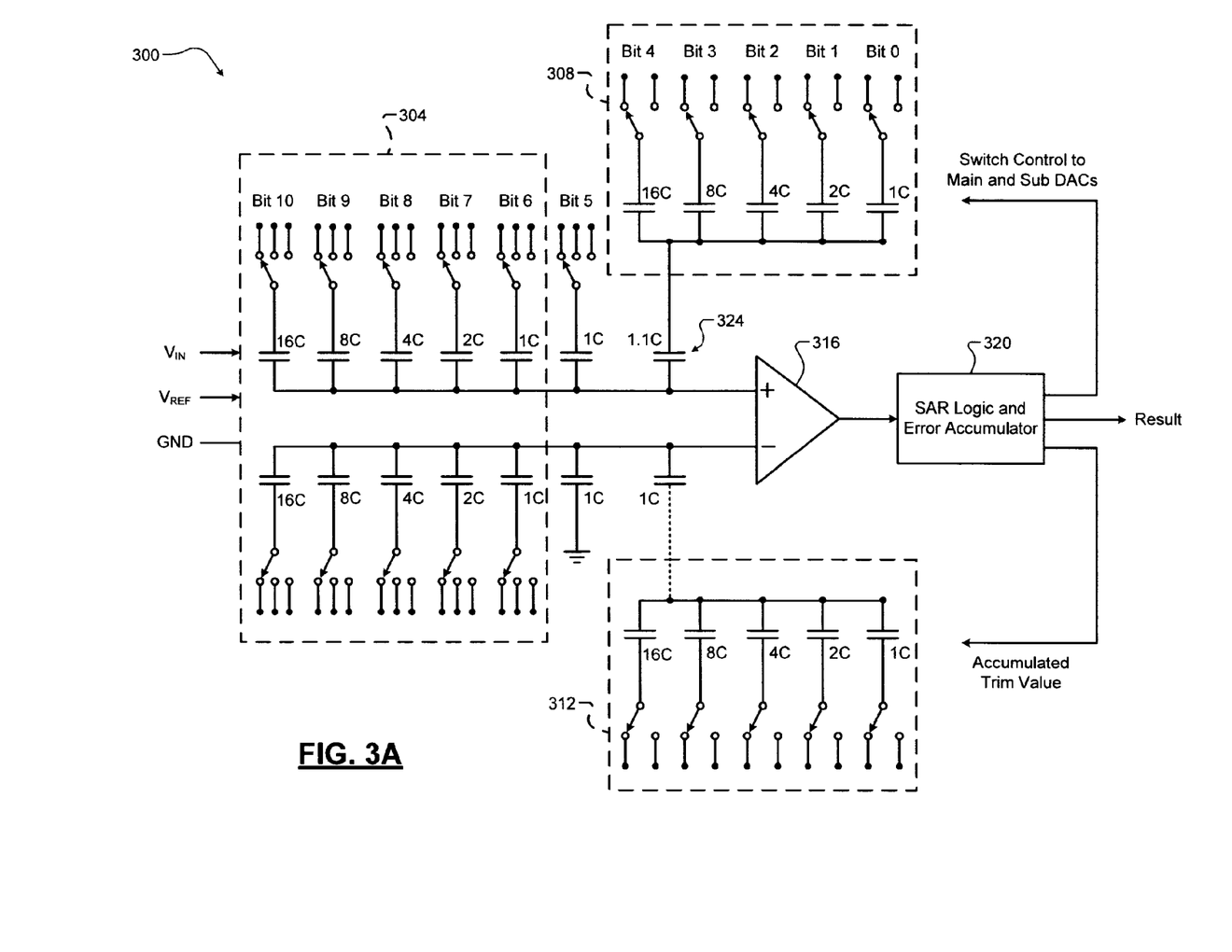
FIG. 3A is a circuit diagram of an SAR ADC that includes a main differential capacitive DAC and sub capacitive DACs according to some implementations of the present disclosure.

Referring now to FIG. 3A, an SAR ADC 300 is shown having a main differential capacitive DAC 304, sub capacitive DACs 308 and 312, a comparator 316, and an SAR logic and error accumulator 320. As previously mentioned, the main differential capacitive DAC 304 is associated with fewer bits than an overall resolution of the SAR ADC 300. For example, as shown, the SAR ADC 300 has a 10-bit resolution, but the main differential capacitive DAC 304 is associated with bits 6 through 10 (bit 10 being the MSB of the SAR ADC 300). The sub capacitive DACs 308, 312, on the other hand, are associated with the remaining bits 0 through 4 (bit 0 being the LSB of the SAR ADC 300).

While separate sub capacitive DACs 308 and 312 are shown, the sub capacitive DACs 308, 312 may collectively represent a single sub capacitive DAC having differential ends 308 and 312, respectively. In addition, while a main differential capacitive DAC 304 and two sub capacitive DACs 308, 312 are shown, the SAR ADC 300 may alternatively include a main non-differential capacitive DAC 304 and one sub capacitive DAC 308. For example, the other sub capacitive DAC 312 may be used for differential operations or for analog gain trim, which is explained in detail below. Alternatively, however, the other sub capacitive DAC 312 may be used for other operations such as partial conversions.

As previously discussed, implementing a main capacitive DAC 304 and a sub capacitive DAC 308 decreases area. More specifically, a largest capacitor in both the main capacitive DAC 304 and the sub capacitive DAC 308 is merely 16 times a size of an LSB capacitor (compared to 512 times the size of an LSB capacitor in a single 10-bit capacitive DAC). A summing node of the sub capacitive DAC 308 is connected to the positive output of the main capacitive DAC 304 via a coupling capacitor 324. For example, as shown the magnitude of the coupling capacitor 324 is approximately 1.1 times the size of the LSB.

Due to manufacturing tolerances, the sub capacitive DAC 308 may be mismatched with respect to the main capacitive DAC 304. Conventional SAR ADC controllers, therefore, may trim the main capacitive DAC 304 and the sub capacitive DACs 308, 312 in order to achieve matching. For example, trimming in an SAR ADC may refer to accumulating error and adjusting comparisons based on the accumulated error. Unmatched main and sub capacitive DACs 304, 308 may increase differential non-linearity (DNL), which decreases precision of the SAR ADC 300.

Figure 3B:
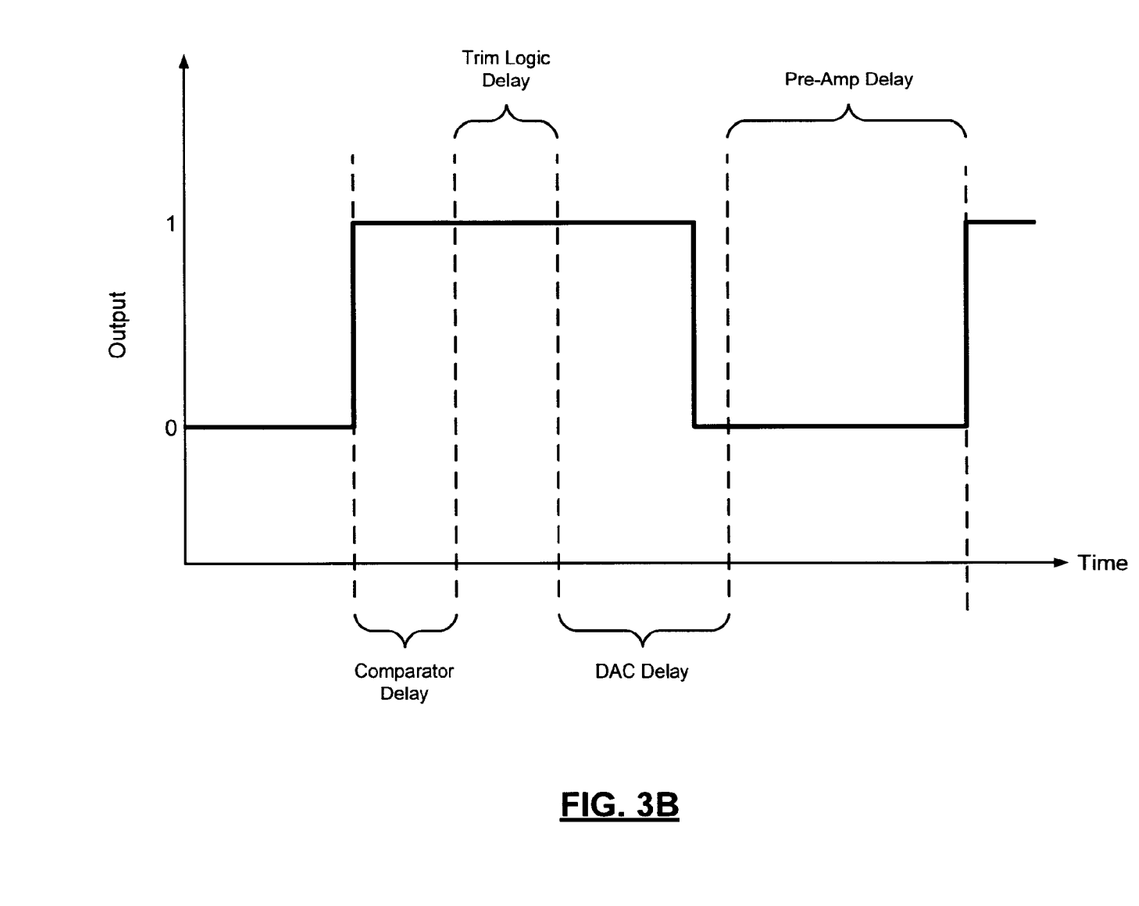
FIG. 3B is a timing diagram illustrating trim delay for the SAR ADC of FIG. 3A.

Trimming each element of the DACs 304, 308, and 312, increases conversion delay of the SAR ADC 300. For example, FIG. 3B illustrates simulated trim delay for the SAR ADC 300 of FIG. 3A. As shown, the additional trim delay occurs after a delay of the comparator 316 and before delays of the main capacitive DAC 304 and additional pre-amp delay. The sum of the comparator delay, the trim delay, the DAC delay, and the pre-amp delay represents a total delay of the SAR ADC 300, which also corresponds to a maximum operating frequency. Therefore, increased trim delay may decrease the maximum operating frequency of the SAR ADC 300.

Accordingly, systems are presented for improved trimming operations in SAR ADCs. The systems first accumulate error associated with a main capacitive DAC in the SAR ADC. The systems, however, ignore error associated with a sub capacitive DAC of the SAR ADC because sub capacitive DAC DNL errors are small enough to not require trimming. The systems may then use a gain trim module to trim a gain of the sub capacitive DAC based on an accumulated error associated with the main capacitive DAC. More specifically, the gain trim module may selectively provide a variable capacitance between a summing node between the sub capacitive DAC and a reference node between the main capacitive DAC and a comparator.

For example, the gain trim module may include a plurality of switches and a plurality of capacitors. The plurality of switches are configured to selectively connect or disconnect the plurality of capacitors from the summing node of the sub capacitive DAC, respectively. An SAR control module may control the plurality of switches based on the accumulated error associated with the main capacitive DAC, which provides the variable capacitance at the summing node of the sub capacitive DAC and thereby adjusts the gain of the sub capacitive DAC. The systems, therefore, provide for faster trimming of an SAR ADC, while also decreasing size/area, decreasing power, and improving DNL.

Figure 4A:
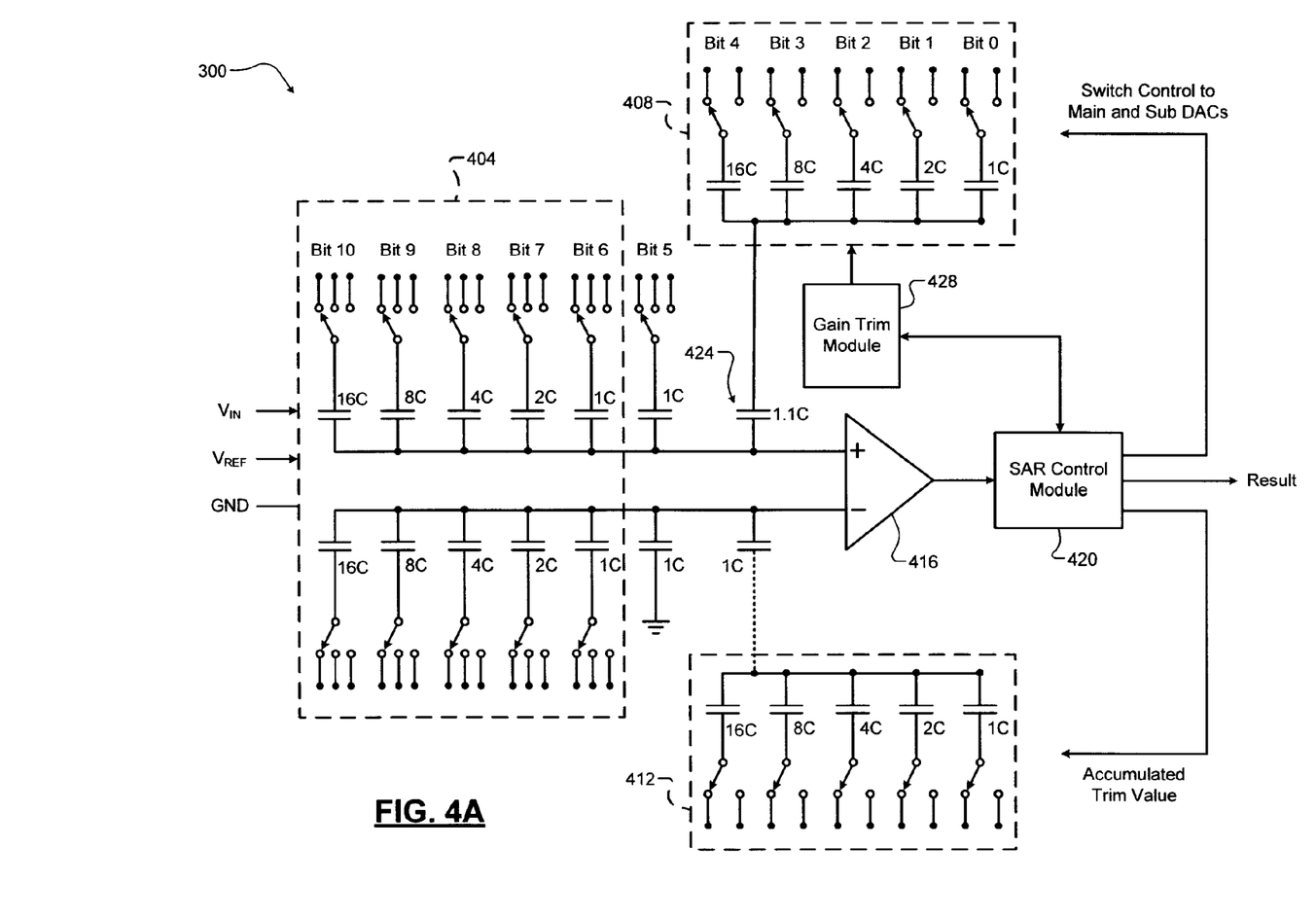
FIG. 4A is a circuit diagram of an SAR ADC that includes a main differential capacitive DAC, sub capacitive DACs, and a gain trim module according to some implementations of the present disclosure.

Referring now to FIG. 4A, an example SAR ADC 400 is shown. The SAR ADC 400 includes a main differential capacitive DAC 404, sub capacitive DACs 408 and 412, a comparator 416, an SAR control module 420, and a gain trim module 428. Sub capacitive DAC 408 may be connected to a positive output of the main differential capacitive DAC 404 via a coupling capacitor 424.

As previously mentioned, the main differential capacitive DAC 404 is associated with fewer bits than an overall resolution of the SAR ADC 400. For example, as shown, the SAR ADC 400 has a 10-bit resolution, but the main differential capacitive DAC 404 is associated with bits 6 through 10 (bit 10 being the MSB of the SAR ADC 400). The sub capacitive DACs 408, 412, on the other hand, are associated with the remaining bits 0 through 4 (bit 0 being the LSB of the SAR ADC 400). The main differential capacitive DAC 404 receives an input signal ($V_{IN}$) and a reference signal ($V_{REF}$) and produces an output voltage based on the input signal $V_{IN}$, the reference signal $V_{REF}$, and a combination of one or more of the capacitors associated with bits 6 through 10. The main differential capacitive DAC 400 may have positive and negative (differential) outputs.

A summing node of the sub capacitive DAC 408 is connected to the positive output of the main capacitive DAC 404 via the coupling capacitor 424. For example, the magnitude of the coupling capacitor 424 may approximately 1.1 times the size of the LSB (as shown). The combined outputs of the main differential capacitive DAC 404 (the positive output) and the sub capacitive DAC 408 is provided to a positive input of the comparator 416. In addition, during differential operations, analog trim operations, or other operations (e.g., partial conversions), the combined outputs of the main differential capacitive DAC 404 (the negative output) and the sub capacitive DAC 412 is provided to a negative input of the comparator 416. As previously described, sub capacitive DACs 408, 412 may collectively form a single sub capacitive DAC, but are divided as shown for explanatory purposes.

The comparator 416 generates a signal for the SAR control module 420 by comparing its positive and negative inputs. The SAR control module 420 controls switching in each of the main differential capacitive DAC 404 and the sub capacitive DACs 408, 412 during a conversion cycle. The SAR control module 420 also trims the main differential capacitive DAC 404. More specifically, the SAR control module 420 may accumulate error associated with bits 6 through 10 of the main differential capacitive DAC 404. The SAR control module 420 may then trim the gain of the sub capacitive DAC 408 using the gain trim module 428. More specifically, the SAR control module 420 may control the gain trim module 428 to trim a gain of the sub capacitive DAC 408 based on the accumulated error associated with the main differential capacitive DAC 404.

As previously mentioned, sub capacitive DAC 412 may be used for analog trim operations. Therefore, when analog trim is used, the SAR control module 420 may also control sub capacitive DAC 412 based on the accumulated error associated with the main differential capacitive DAC 404. Sub capacitive DAC 412, however, may also not be used for trimming, and may merely be used for differential operations or other operations such as partial conversions. After trimming, the SAR control module 420 may perform the conversion, store the result in a register, and output the resulting digital signal.

Figure 4B:
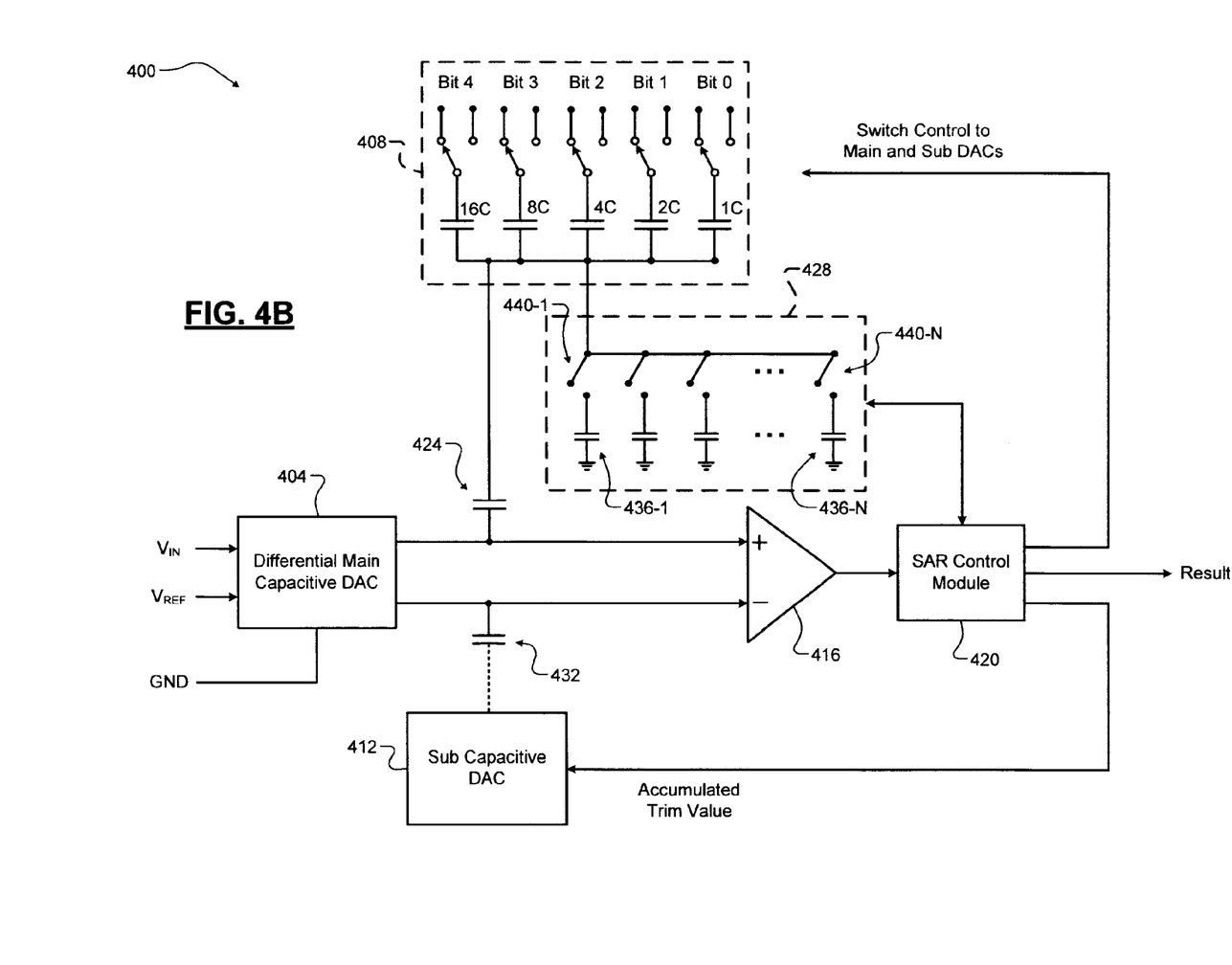
FIG. 4B is a circuit diagram of an example of the gain trim module of FIG. 4A according to some implementations of the present disclosure.

Referring now to FIG. 4B, an example of the gain trim module 428 of FIG. 4A is shown. The gain trim module 428 includes a plurality of switches 436-1 . . . 436-N (N>1, collectively referred to as switches 436) that selectively connect or disconnect a plurality of capacitors 440-1 . . . 440-N (collectively referred to as capacitors 440), respectively. For example, each of the capacitors 440 may have a different size. The gain trim module 428, however, may include other combinations of switches and/or capacitors. For example only, the gain trim module 428 may include both series and parallel capacitors. Alternatively, the gain trim module 428 may include other combinations of elements for providing a variable capacitance.

Figure 4C:
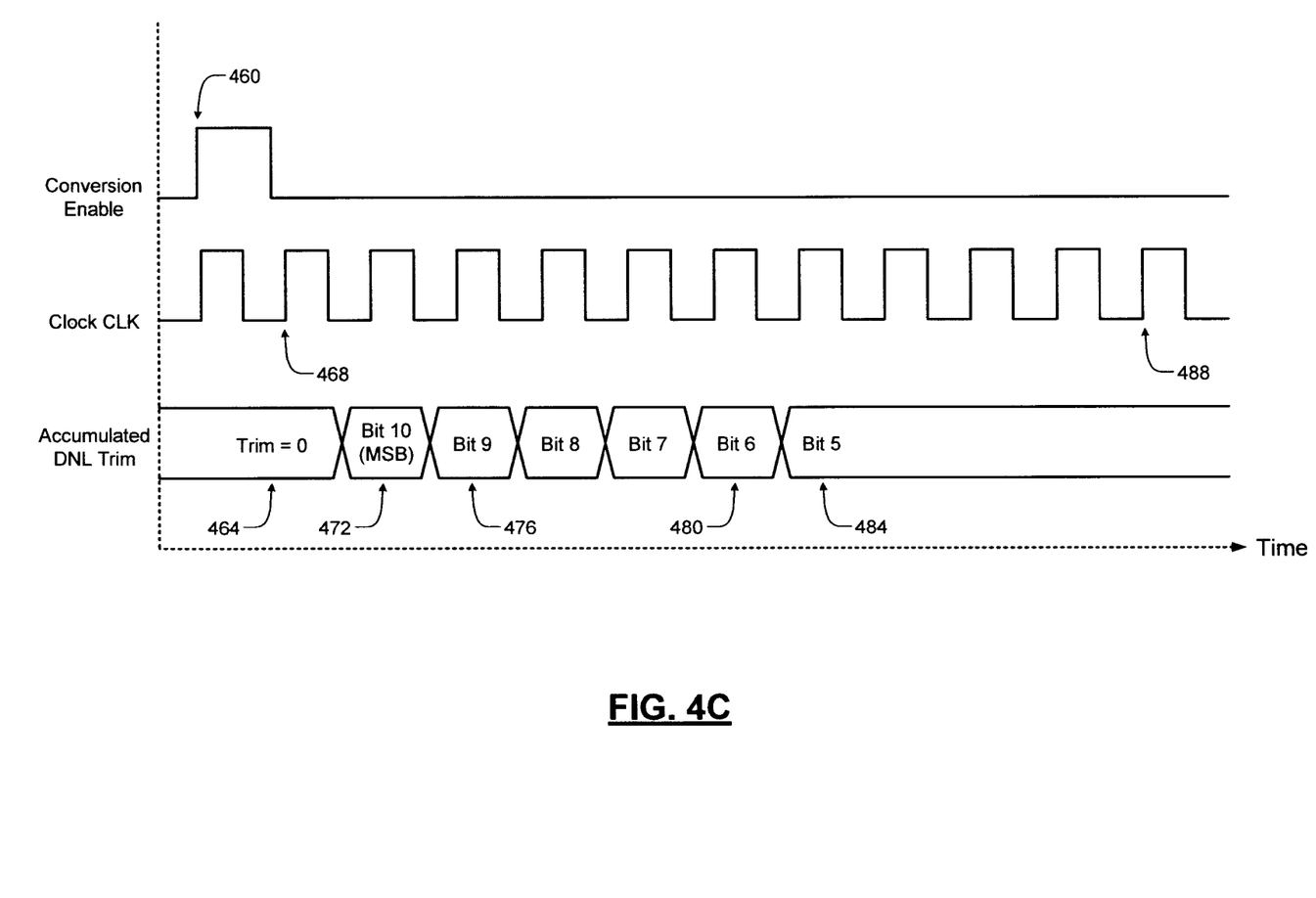
FIG. 4C is a timing diagram illustrating sub DAC gain trim according to some implementations of the present disclosure.

Referring now to FIG. 4C, a timing diagram of the SAR ADC 400 of FIG. 4A is shown. Conversion by the SAR ADC 400 is enabled at 460 via a conversion enable signal. At the start of the conversion, the accumulated DNL error is zero as shown at 464. At rising edge 468 of clock signal CLK, the SAR ADC 400 tests the MSB and the comparator 416 makes a decision (i.e., generates a comparison) after some delay. If the decision/result of the comparator 416 is "keep" (or a 1), the trim code for the MSB is added as shown at 472. The testing process continues as described for bit 9 (at 476) through bit 6 (at 480) of the main differential capacitive DAC 404. In addition, the testing process may be performed for bit 5 at 484. The testing process, however, may then stop. Point 488 indicates a rising edge of the clock signal CLK where the LSB (of sub capacitive DAC 408) would typically be tested. The gain trim module 428 of the present disclosure, however, provides for trimming the gain of the sub capacitive DAC 408 instead of trimming elements in the sub capacitive DAC 408, thereby decreasing trim time, surface area, and/or power consumption.

Figure 5:
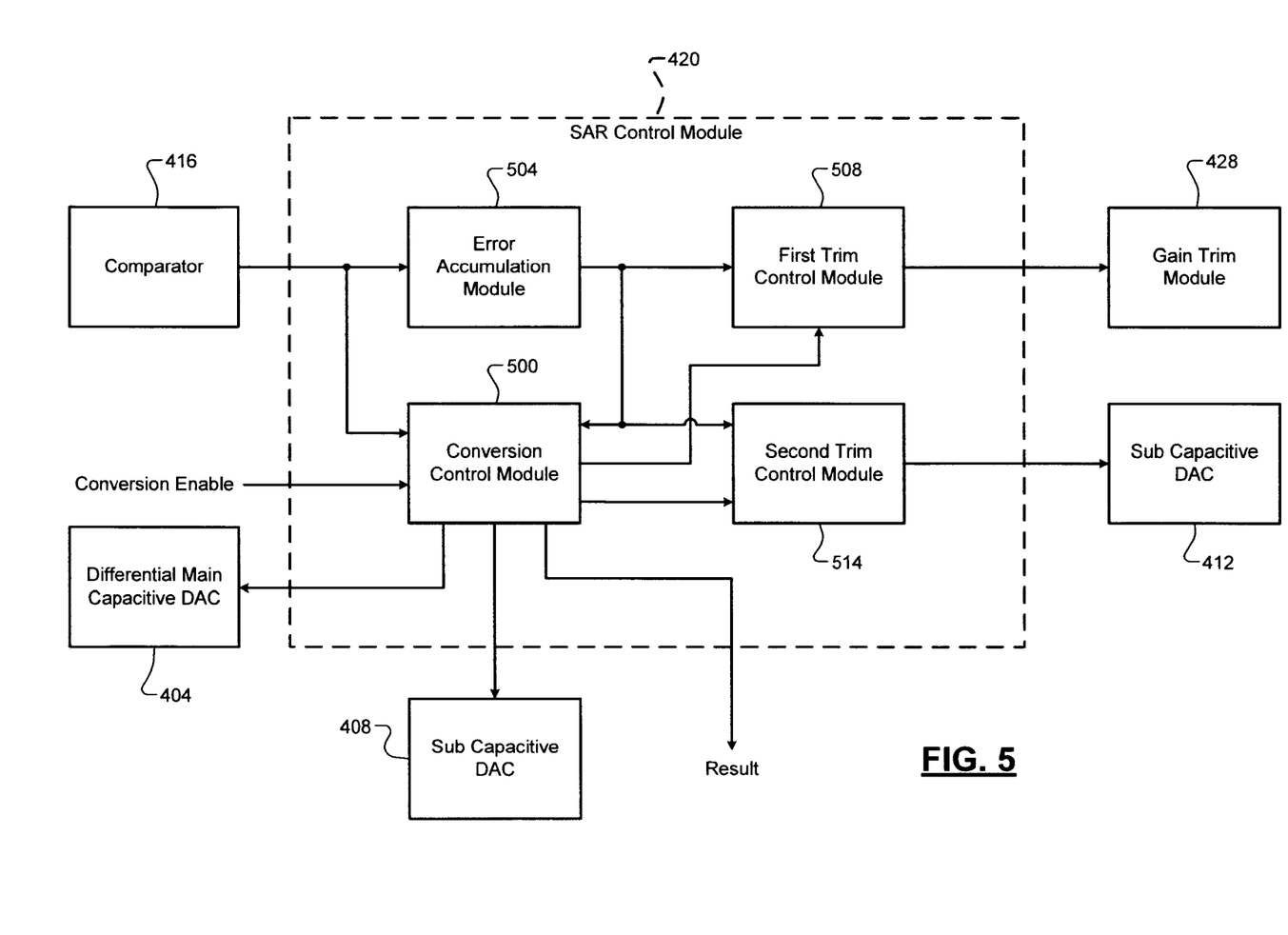
FIG. 5 is a functional block diagram of an example of the SAR control module of FIG. 4A according to some implementations of the present disclosure.

Referring now to FIG. 5, an example of the SAR control module 420 is shown. The SAR control module 420 may include a conversion control module 500, an error accumulation module 504, a first trim control module 508, and a second trim control module 512.

The conversion control module 500 controls the conversion process of the SAR ADC 400. The conversion control module 500 may be initiated by a conversion enable signal (as previously described above with respect to FIG. 4C). The conversion control module 500 may start the conversion process by trimming (i.e., calibrating) the SAR ADC 400. The conversion control module 500 may begin trimming the SAR ADC 400 by testing the bits of the main differential capacitive DAC 404. The error accumulation module 504 may determine and accumulate DNL trim error associated with the various bits of the main differential capacitive DAC 404 (depending on result/comparisons by the comparator 416). The error accumulation module 504 may send the accumulated error to the conversion control module 500.

After trimming of the main differential capacitive DAC 404 is complete, the conversion control module 500 may then initiate or control the first trim control module 508. The first trim control module 508 controls the gain trim module 428, which selectively trims a gain of the sub capacitive DAC 408. As previously mentioned, the first trim control module 508 may control the gain trim module 428 based on the accumulated error associated with the main differential capacitive DAC 404. In addition, when analog trim is used, the conversion control module 500 may also initiate or control the second trim control module 512, which may control the sub capacitive DAC 412 based on the accumulated error associated with the main differential capacitive DAC 404 to perform analog trimming (e.g., a running sum).

After trimming of the SAR ADC 400 is complete, the conversion control module 500 may perform a conversion cycle. More specifically, the conversion control module 500 may convert an analog input signal to a digital output signal. The conversion control module 500 may control switching in the DACs 404, 408, and/or 412 to perform the conversion. More specifically, the conversion control module 500 may implement a binary search algorithm (as previously described) to determine binary values for each of the bits of the SAR ADC 400 (bits 0 through 10). The conversion control module 500 may store the determined bits in a register (not shown). The conversion control module 500 may also output the result (the digital output signal).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

What is claimed is:

1. A system for a successive-approximation-register analog-to-digital converter (SAR ADC) including a main capacitive digital-to-analog converter (DAC) and a sub capacitive DAC, the system comprising:
    an SAR control module that determines an accumulated error associated with the main capacitive DAC of the SAR ADC and generates a control signal based on the accumulated error; and
    a gain trim module that receives the control signal based on the accumulated error and selectively trims a gain of the sub capacitive DAC in response to the control signal.

2. A system for a successive-approximation-register analog-to-digital converter (SAR ADC), the system comprising:
    a gain trim module configured to selectively trim a gain of a sub capacitive digital-to-analog converter (DAC) of the SAR ADC; and
    an SAR control module that controls the gain trim module based on an accumulated error associated with a main capacitive DAC of the SAR ADC,
    wherein the gain trim module selectively trims the gain of the sub capacitive DAC by selectively connecting a variable capacitance between a summing node of the sub capacitive DAC and a reference node.

3. The system of claim 2, wherein the gain trim module includes a plurality of switches and a plurality of capacitors, and wherein the plurality of switches selectively connect or disconnect the plurality of capacitors, respectively, from the summing node to provide the variable capacitance.

4. The system of claim 3, wherein the SAR control module selectively controls the switches in the gain trim module based on the accumulated error associated with the main capacitive DAC.

5. The system of claim 4, wherein the accumulated error associated with the main capacitive DAC includes differential non-linearity (DNL) for bits of the main capacitive DAC.

6. The system of claim 5, wherein the SAR control module determines the accumulated error based on comparisons generated by a comparator, wherein the comparator generates the comparisons based on at least one of outputs of the main capacitive DAC and the sub capacitive DAC.

7. The system of claim 1, wherein the SAR control module selectively controls switching in the main capacitive DAC and the sub capacitive DAC during a conversion cycle.

8. The system of claim 1, wherein the main capacitive DAC is a differential capacitive DAC, and wherein the SAR ADC further includes another sub capacitive DAC.

9. The system of claim 8, wherein the SAR control module performs analog trimming by controlling the other sub capacitive DAC.

10. The system of claim 9, wherein the SAR control module controls the other sub capacitive DAC based on the accumulated error associated with the differential capacitive DAC.

11. A successive-approximation-register analog-to-digital converter (SAR ADC), comprising:
    a main capacitive digital-to-analog converter (DAC) that selectively generates a first output based on an input value, a reference value, and one or more of a first plurality of capacitors;
    a sub capacitive DAC that selectively generates a second output based on the input value, the reference value, and one or more of a second plurality of capacitors;
    a comparator that generates comparisons based on at least one of the first and second outputs;
    a gain trim module configured to selectively trim a gain of the sub capacitive DAC; and an SAR control module that selectively controls the gain trim module based on an accumulated error associated with the main capacitive DAC, wherein the accumulated error is based on the comparisons generated by the comparator.

12. The SAR ADC of claim 11, wherein the gain trim module selectively trims the gain of the sub capacitive DAC by selectively connecting a variable capacitance between a summing node of the sub capacitive DAC and a reference node.

13. The SAR ADC of claim 12, wherein the gain trim module includes a plurality of switches and a plurality of capacitors, wherein the plurality of switches selectively connect or disconnect the plurality of capacitors, respectively, from the summing node to provide the variable capacitance.

14. The SAR ADC of claim 13, wherein the SAR control module selectively controls the plurality of switches in the gain trim control module based on the accumulated error associated with the main capacitive DAC.

15. The SAR ADC of claim 14, wherein the accumulated error associated with the main capacitive DAC includes differential non-linearity (DNL) for bits of the main capacitive DAC.

16. The SAR ADC of claim 11, wherein after accumulating the error associated with the main capacitive DAC, the SAR control module trims the gain of the sub capacitive DAC based on the accumulated error associated with the main capacitive DAC and then performs a conversion cycle.

17. The SAR ADC of claim 16, wherein the SAR control module selectively controls switching in the main capacitive DAC and the sub capacitive DAC during the conversion cycle.

18. The SAR ADC of claim 11, wherein the main capacitive DAC is a differential capacitive DAC, and wherein the SAR ADC further comprises another sub capacitive DAC.

19. The SAR ADC of claim 18, wherein the SAR control module performs analog trimming by controlling the other sub capacitive DAC.

20. The SAR ADC of claim 19, wherein the SAR control module controls the other sub capacitive DAC based on the accumulated error associated with the differential capacitive DAC.

* * * * *

UNITED STATES PATENT AND TRADEMARK OFFICE
CERTIFICATE OF CORRECTION

| | | |
|---|---|---|
| PATENT NO. | : 8,547,270 B1 | Page 1 of 1 |
| APPLICATION NO. | : 13/234595 | |
| DATED | : October 1, 2013 | |
| INVENTOR(S) | : Jonathan Ronald Francis Strode | |

It is certified that error appears in the above-identified patent and that said Letters Patent is hereby corrected as shown below:

In the Drawings:

Sheet 1 of 8, Fig. 1A — Delete "Analog Inout" and insert --Analog Input--

Sheet 5 of 8, Reference Numeral 300, Fig. 4A — Delete "300" and insert --400--

Sheet 8 of 8, Reference Numeral 514, Fig. 5 — Delete "514" and insert --512--

In the Specifications:

Column 1, Line 26 — Delete "circuit (S/H)" and insert --(S/H) circuit--

Column 1, Line 27 — Delete "(DAC) converter" and insert --converter (DAC)--

Column 1, Line 38 — Delete "$V_{DAC}$" and insert --$V_{DAC}=$--

Signed and Sealed this
Eighteenth Day of February, 2014

Michelle K. Lee
*Deputy Director of the United States Patent and Trademark Office*